(12) United States Patent
Chandolu et al.

(10) Patent No.: US 10,971,409 B2
(45) Date of Patent: Apr. 6, 2021

(54) METHODS AND SYSTEMS FOR MEASURING SEMICONDUCTOR DEVICES

(71) Applicant: Micron Technology, Inc., Boise, ID (US)

(72) Inventors: Anilkumar Chandolu, Boise, ID (US); Lisa R. Copenspire-Ross, Boise, ID (US); Michael D. Kenney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 16/233,728

(22) Filed: Dec. 27, 2018

(65) Prior Publication Data

US 2020/0211912 A1 Jul. 2, 2020

(51) Int. Cl.
| | |
|---|---|
| *H01L 23/58* | (2006.01) |
| *H01L 21/66* | (2006.01) |
| *G01N 21/95* | (2006.01) |
| *H01L 23/00* | (2006.01) |

(52) U.S. Cl.
CPC ......... *H01L 22/12* (2013.01); *G01N 21/9501* (2013.01); *H01L 22/26* (2013.01); *H01L 22/32* (2013.01); *H01L 24/09* (2013.01); *H01L 24/17* (2013.01)

(58) Field of Classification Search
CPC ......... H01L 22/12; H01L 22/26; H01L 22/32; H01L 24/09; H01L 24/17
USPC .......................................................... 257/48
See application file for complete search history.

(56) References Cited

U.S. PATENT DOCUMENTS

| | | | | |
|---|---|---|---|---|
| 5,868,560 | A * | 2/1999 | Tamada | G03F 7/70633 430/5 |
| 9,177,837 | B2 * | 11/2015 | Lin | H01L 21/568 |
| 10,438,887 | B2 * | 10/2019 | Lin | H01L 25/50 |
| 2011/0291246 | A1 * | 12/2011 | Jo | H01L 23/481 257/621 |
| 2016/0099229 | A1 * | 4/2016 | Choi | H01L 23/481 257/737 |

* cited by examiner

*Primary Examiner* — Tan N Tran
(74) *Attorney, Agent, or Firm* — Perkins Coie LLP (57) ABSTRACT

Semiconductor devices having measurement features and associated systems and methods are disclosed herein. In one embodiment, a semiconductor device includes a plurality of stacked semiconductor dies each having measurement features formed along an outer periphery of a surface thereof. One or more image capture devices can image the semiconductor device and a controller can detect the measurement features in imaging data received from the image capture devices. The controller can further determine the distance between two or more of the measurement features to estimate a bond line thickness between semiconductor dies in the stack.

13 Claims, 9 Drawing Sheets

METHODS AND SYSTEMS FOR MEASURING SEMICONDUCTOR DEVICES

TECHNICAL FIELD

The present technology generally relates to semiconductor devices, and more particularly relates to semiconductor devices including measurement features for determining a die-to-die separation between stacked semiconductor dies, and associated systems and methods.

BACKGROUND

Packaged semiconductor dies, including memory chips, microprocessor chips, and imager chips, typically include a semiconductor die mounted on a substrate and encased in a protective covering. The semiconductor die includes functional features, such as memory cells, processor circuits, and imager devices, as well as bond pads electrically connected to the functional features. The bond pads can be electrically connected to terminals outside the protective covering to allow the semiconductor die to be connected to higher level circuitry. Within some packages, semiconductor dies can be stacked upon and electrically connected to one another by individual interconnects placed between adjacent semiconductor dies. In such packages, each interconnect can include a conductive material (e.g., solder) and a pair of contacts on opposing surfaces of adjacent semiconductor dies. For example, a metal solder can be placed between the contacts and reflowed to form a conductive joint.

One challenge with such traditional packages is that significant variation can exist in the thickness of the solder joints of each interconnect. For example, the solder joint thickness can vary if, for example, variations in heat and/or force exist during a bonding operation to form the interconnects. This can affect the quality of the interconnects, for example, by leading to an open-circuit across the solder joints, high ohmic resistance across the solder joints, or solder bridging between nearby interconnects. The varying solder joint thickness can also cause the stacked semiconductor dies to warp or be put out of parallel planar alignment.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of semiconductor devices having measurement features for determining a separation between stacked semiconductor dies, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-8.

In several of the embodiments described below, a semiconductor die assembly includes a first semiconductor die, a second semiconductor die stacked over the first semiconductor die, and a plurality of interconnects electrically coupling an upper surface of the first semiconductor die to a lower surface of the second semiconductor die. The first semiconductor die includes a plurality of first measurement features on the upper surface of the first semiconductor die and adjacent to at least one side of the first semiconductor die. The second semiconductor die includes a plurality of second measurement features on an upper surface of the second semiconductor die and adjacent to at least one side of the second semiconductor die. The distances between corresponding ones of the pluralities of first and second measurement features can correspond to the separation of the first and second semiconductor dies and/or to the thickness of the interconnects (e.g., to a solder joint thickness of the interconnects). In some embodiments, the semiconductor die assembly can be imaged and the measurement features detected in the image to determine the thickness of the interconnects, a degree of warpage of the semiconductor dies, a degree of parallelism of the semiconductor dies, etc. Thus, the present technology can advantageously facilitate measurements of a semiconductor die assembly to, for example, assess the quality of a thermo-compression bonding (TCB) operation.

In contrast, conventional techniques for measuring die-to-die separation generally require a destructive mechanical cross-section of a representative semiconductor die assembly. Such cross-sections are wasteful, costly, and reduce the yield of a semiconductor device manufacturing process. Another conventional technique includes assessing the quality of a TCB operation based on electrical data from a semiconductor die assembly. However, the requisite electrical data is often unobtainable until fabrication of the semiconductor die assembly is complete—which can be significantly after a TCB operation.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. The headings provided herein are for convenience only and should not be construed as limiting the subject matter disclosed.

Figure 1:
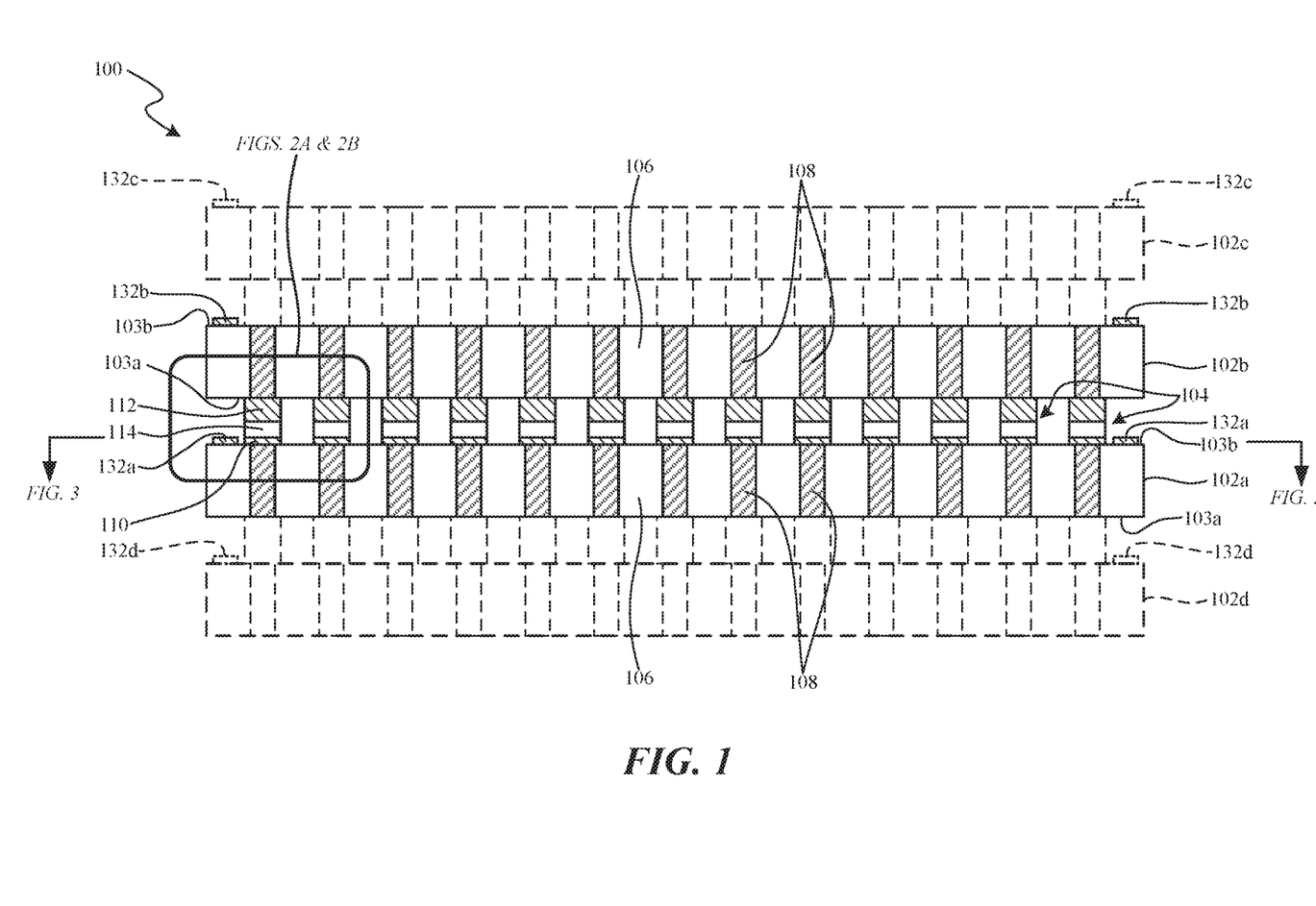
FIG. 1 is a side cross-sectional view of a semiconductor die assembly in accordance embodiments of the present technology.

FIG. 1 is a side cross-sectional view of a semiconductor die assembly 100 ("assembly 100") configured in accordance with embodiments of the present technology. The assembly 100 includes a first semiconductor die 102a and a second semiconductor die 102b adjacent to (e.g., stacked over) the first semiconductor die 102a. The semiconductor dies 102 each include a first (e.g., lower) surface 103a and a second (e.g., upper) surface 103b opposite the first surface 103a. The assembly 100 also includes an array of individual interconnects 104 extending vertically between the second surface 103b of the first semiconductor die 102a and the first surface 103a of the second semiconductor die 102b. In the illustrated embodiment, the interconnects 104 each include a first conductive feature (e.g., a conductive pad 110) on the second surface 103b of the first semiconductor die 102a, a second conductive feature (e.g., a conductive pillar 112) on the first surface 103a of the second semiconductor die 102b, and a bond material 114 bonding the conductive pillar 112 to the conductive pad 110. In some embodiments, the assembly 100 can include a smaller or greater number of interconnects 104 than shown in FIG. 1. For example, the assembly 100 can include tens, hundreds, thousands, or more interconnects 104 arrayed between the semiconductor dies 102. In some embodiments, the interconnects 104 have a total height or thickness (also known to those skilled in the art as a "bond line thickness") of between about 20-35 μm. In certain embodiments, the conductive pillars 112 have a thickness of between about 10-30 μm (e.g., about 18 μm) and the conductive pads 110 have a thickness of between about 1-5 μm (e.g., about 4 μm).

The assembly 100 further includes first measurement features (e.g., first fiducial markers) 132a on the second surface 103b of the first semiconductor die 102a and second measurement features (e.g., second fiducial markers) 132b on the second surface 103b of the second semiconductor die 102b. As described in further detail below with reference to FIGS. 3 and 4, the measurement features 132 are positioned on the second surfaces 103b of the semiconductor dies 102 proximate to (e.g., adjacent to) a perimeter of the semiconductor dies 102. In some embodiments, the measurement features 132 are not electrically coupled to the semiconductor dies 102. In certain embodiments, the measurement features 132 can be formed as an extension of the metallization process used to form the conductive pads 110. For example, the measurement features 132 and conductive pads 110 can be formed at the same processing stage and/or simultaneously during a suitable masking and plating process. Accordingly, at least some of the characteristics of the measurement features 132 and the conductive pads 110 can be the same or substantially similar. For example, the measurement features 132 can have the same or substantially the same thickness as the conductive pads 110 and, in some embodiments, the measurement features 132 have a thickness of between about 1-5 μm (e.g., about 4 μm). Similarly, the measurement features 132 can comprise the same metal material (e.g., copper, nickel, gold, silicon, tungsten, etc.) as the conductive pads 110.

As further shown in FIG. 1, each of the semiconductor dies 102 includes a semiconductor substrate 106 (e.g., a silicon substrate, a gallium arsenide substrate, an organic laminate substrate, etc.) and through-substrate vias (TSVs) 108 extending through the substrate 106 from the first side 103a to the second side 103b of the semiconductor die 102. The TSVs 108 are coupled to corresponding ones of the interconnects 104 and, in some embodiments, the TSVs 108 can be coupled to substrate pads, a redistribution layer, and/or other conductive features (not shown) located on either side of the semiconductor substrate 106. Each substrate 106 can include integrated circuitry coupled to one or more of the TSVs 108. The integrated circuity can include, for example, a memory circuit (e.g., a dynamic random memory (DRAM)), a controller circuit (e.g., a DRAM controller), a logic circuit, and/or other circuits.

In the illustrated embodiment, the assembly 100 includes two semiconductor dies 102. In other embodiments, however, the assembly 100 can include a different number of semiconductor dies, such as three dies, four dies, eight dies, sixteen dies, or more. For example, the assembly 100 can include a third semiconductor die 102c (shown in hidden lines) on the second semiconductor die 102b, and a fourth semiconductor die 102d (shown in hidden lines) on the first semiconductor die 102a. In some embodiments, each of the semiconductor dies 102 in the assembly 100 can include similar components and/or have similar configurations. For example, third measurement features 132c (shown in hidden lines) can be formed on the third semiconductor die 102c and/or fourth measurement features 132d (shown in hidden lines) can be formed on the fourth semiconductor die 102d. In some embodiments, the assembly 100 can also include other structures or features such as, for example: (i) a casing (e.g., a thermally conductive casing that encloses the semiconductor dies 102 within an enclosure), (ii) an underfill material deposited or otherwise formed around and/or between the semiconductor dies 102, and/or (iii) a support substrate (e.g., an interposer and/or a printed circuit board configured to operably couple the semiconductor dies 102 to external circuitry).

Figure 2A:
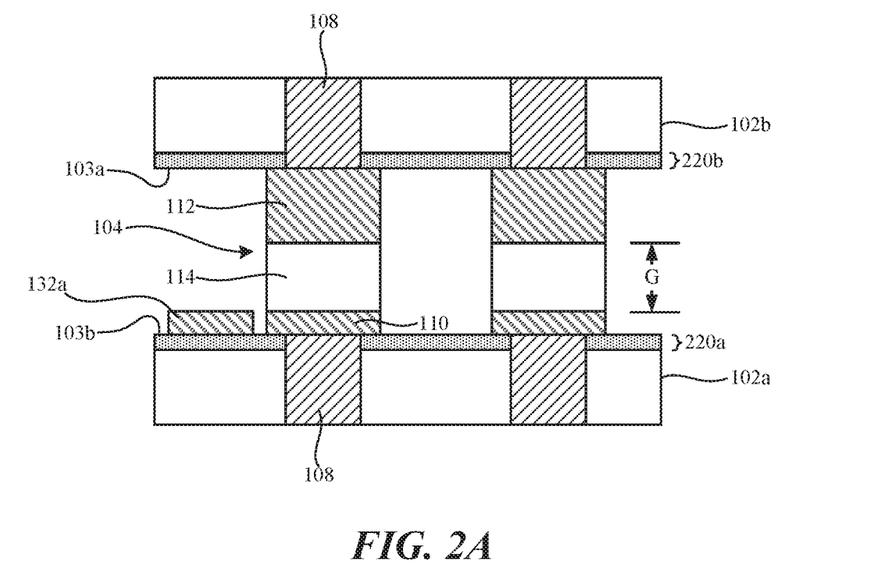
FIGS. 2A and 2B are enlarged side cross-sectional views of the semiconductor die assembly of FIG. 1 at various stages in a method of manufacture in accordance with embodiments of the present technology.
Figure 2B:
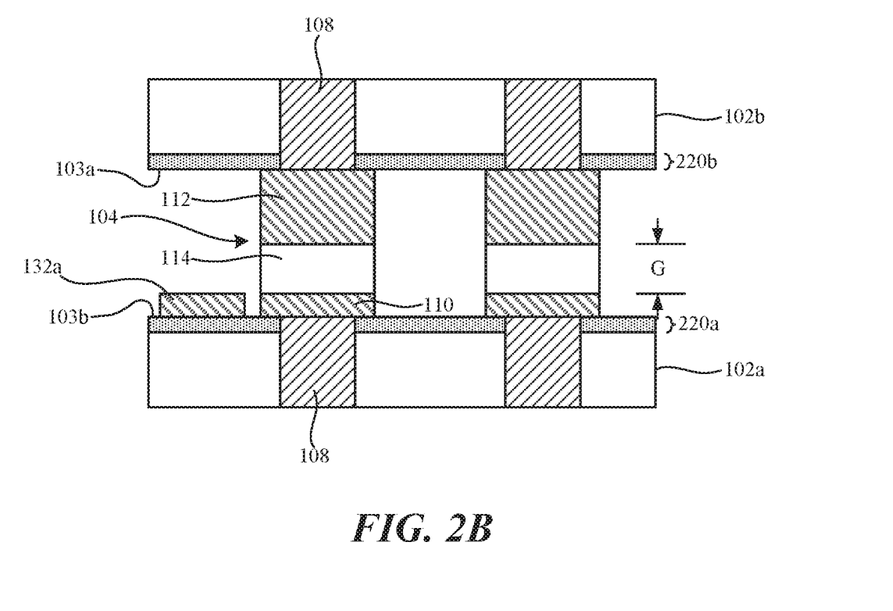

FIGS. 2A and 2B are enlarged cross-sectional views showing several interconnects 104 of the semiconductor die assembly 100 at various stages in a method of manufacture in accordance with embodiments of the present technology. Referring to FIGS. 2A and 2B together, in some embodiments, the conductive pads 110 can be coupled to or form a part of a first redistribution structure 220a at the second surface 103b of the first semiconductor die 102a. Similarly, in some embodiments, the conductive pillars 112 can be coupled to or form a part of a second redistribution structure 220b at the first side 103a of the second semiconductor die 102b. Each of the redistribution structures 220 can include various conductive features (e.g., metal traces and/or pads that are coupled to one or more of the interconnects 104, the TSVs 108, etc.) and a passivation material (e.g., an oxide material) configured to provide electrical isolation between the conductive features. In some embodiments, the first measurement features 132a can be formed on the passivation material of the first redistribution structure 220a such that they are not electrically coupled to the TSVs 108 and/or other components of the semiconductor dies 102. In some embodiments, the interconnects 104 can also include barrier materials (not shown; e.g., nickel, nickel-based intermetallic, and/or gold) formed over end portions of the conductive pillars 112 and/or the conductive pads 110. The barrier materials can facilitate bonding and/or prevent or at least inhibit the electromigration of copper or other metals used to form the conductive pillars 112 and the conductive pads 110.

In FIG. 2A, the assembly 100 is illustrated at the beginning of a thermo-compression bonding (TCB) operation, in which heating has caused the bond material 114 in the interconnects 104 to reflow and electrically connect the conductive pillars 112 and the conductive pads 110. In the illustrated embodiment, at the beginning of the TCB operation, the bond material 114 bridges a gap G (also known to those skilled in the art as a solder joint thickness) between the conductive pillars 112 and the conductive pads 110 that is larger than a desired final amount. In some embodiments, the bond material 114 has a thickness of between about 10-20 µm (e.g., about 15 µm) at the beginning of the TCB operation. In FIG. 2B, the assembly 100 is illustrated at the completion of the TCB operation, in which a compressive force has caused the gap G bridged by the bond material 114 of the interconnects 104 to be reduced. By cooling the assembly 100 at this point, the bond material 114 can be solidified, securing the semiconductor dies 102 to one another. In some embodiments, the bond material 114 has a thickness of between about 0-13 µm (e.g., about 6-8 µm) at the completion of the TCB operation.

One drawback with the illustrated TCB operation is that significant variation can exist in the solder joint thickness (i.e., the gap G) of the interconnects 104. For example, individual ones of the conductive pillars 112 may be anywhere from about 1-5 µm out of co-planar alignment after the TCB operation. Such variation can cause warpage of the semiconductor dies 102 and cause the semiconductor dies 102 to be out of parallel planar alignment. Moreover, it can be difficult to measure the solder joint thickness and thus difficult to determine whether (i) a desired final thickness was achieved by the TCB operation, (ii) how much the semiconductor dies 102 may be warped, and/or (iii) a degree of parallelism of the semiconductor dies 102. However, as described in detail below, these properties may be determined by detecting one or more distances (e.g., separations) between the measurement features 132.

Figure 3:
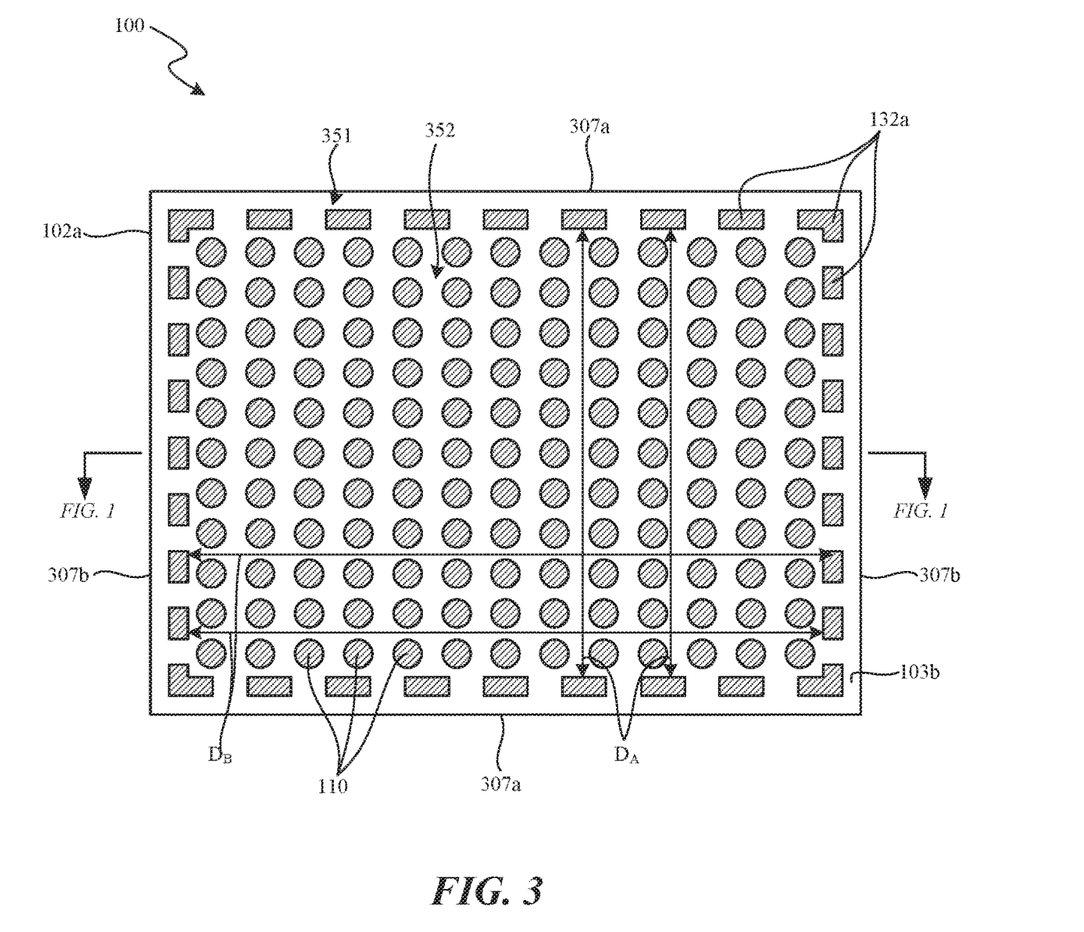
FIG. 3 is a top cross-sectional view of the semiconductor die assembly of FIG. 1 in accordance with embodiments of the present technology.

FIG. 3 is a top cross-sectional view of the semiconductor die assembly 100 showing the second surface 103b of the first semiconductor die 102a, the conductive pads 110, and the first measurement features 132a. In the embodiment illustrated in FIG. 3, the first measurement features 132a are disposed on the second surface 103b of the first semiconductor die 103a at a first region (e.g., an outer region 351) of the first semiconductor die 102a that is proximate to a perimeter of the first semiconductor die 102a. The conductive pads 110 are disposed on the second surface 103b at a second region (e.g., an inner region 352) of the second semiconductor die 102b that is inboard of the outer region 351. That is, the first measurement features 132a can be positioned on the first semiconductor die 102a outboard of the conductive pads 110 and adjacent to a perimeter of the first semiconductor die 102a. In the illustrated embodiment, the first measurement features 132a have a generally rectilinear cross-sectional shape while, in other embodiments, the first measurement features 132a can have other cross-sectional shapes (e.g., circular, oval, irregular, triangular, polygonal, etc.). For example, in some embodiments, the first measurement features 132a and the conductive pads 110 can have substantially the same shape and dimensions.

As further shown in FIG. 3, the first semiconductor die 102a can have a rectangular planform shape having opposing first sides 307a and opposing second sides 307b (collectively "sides 307"), and the first measurement features 132a can be spaced along the outer region 351 adjacent to each of the sides 307. In other embodiments, the first measurement features 132a can be spaced along the outer region 351 adjacent to a different number of the sides 307 (e.g., along only one of the sides 307, along only the two first sides 307a, along only the two second sides 307b, along only one of the first sides 307a and one of the second sides 307b, along three of the sides 307, etc.). In another aspect of the illustrated embodiment, the first measurement features 132a are equally spaced and generally aligned (e.g., horizontally aligned) along the sides 307. In other embodiments, the first measurement features 132a can be spaced differently (e.g., having a varying spacing between adjacent ones of the first measurement features 132a) and/or need not be aligned with any corresponding ones of the first measurement features 132a adjacent a different one of the sides 307. Additionally, although nine first measurement features 132a are shown adjacent to each of the sides 307 in the illustrated embodiment, any number (e.g., more or less than nine) of first measurement features 132a can be formed along the sides 307 and/or a different number of first measurement features 132a can be formed along different ones of the sides 307. In some embodiments, the first measurement features 132a can be spaced apart from an adjacent side 307 of the first semiconductor die 102a by a distance of between about 50-5000 µm (e.g., between about 2000-5000 µm). Moreover, each of the first measurement features 132a can be spaced apart from an adjacent side 307 by the same or substantially the same distance.

In some embodiments, two or more of the first measurement features 132a can be measured to, for example, determine whether the first semiconductor die 102a includes cracks or other irregularities (e.g., as a result of a TCB operation). For example, as described in further detail below with reference to FIG. 5, one or more image capture devices can capture an image of the first semiconductor die 102a (e.g., an image of the second surface 103b), the first measurement features 132a can be detected in the captured image, and the image can be analyzed to (i) determine one or more distances DA between opposing pairs of the first measurement features 132a along the opposing first sides 307a and/or (ii) one or more distances DB between opposing pairs of the first measurement features 132a along the opposing second sides 307b. Cracks or other irregularities can be determined based on variation of the measured distances DA and/or DB from a known separation of the first measurement features 132a when the first semiconductor die 102a is undamaged, and/or based on variation within the measured distances DA and/or DB.

The foregoing description is illustrative of some embodiments of the present technology in which the first semiconductor die 102a has a generally rectangular planform shape. In general, however, the first measurement features 132a can be disposed along the entire perimeter or a portion of the perimeter of the first semiconductor die 102a in accordance with the configuration of the first semiconductor die 102a. For example, where the first semiconductor die 102a has a generally circular planform shape, the first measurement features 132a can be disposed in an arc along the entire perimeter of the first semiconductor die 102a, along opposing portions of the perimeter, along a single portion of the perimeter, etc. The second through fourth measurement features 132b-132d (FIG. 1) can be formed (e.g., disposed on) the second through fourth semiconductor dies 102b-102d, respectively, in a general similar manner as the first measurement features 132a. In certain embodiments, the measurement features 132 can be substantially identical and/or identically arranged on each of the semiconductor dies 102.

Figure 4:
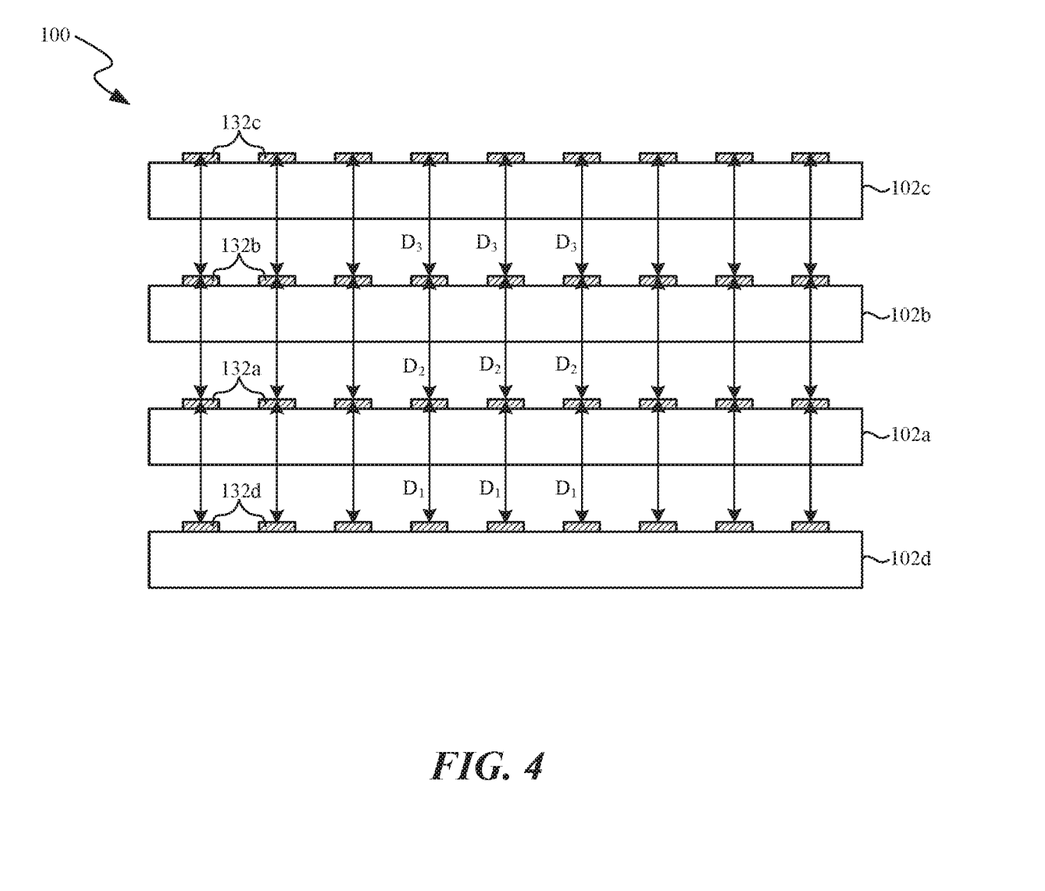
FIG. 4 is a side view of a semiconductor die assembly in accordance with embodiments of the present technology.

FIG. 4 is a side view of the semiconductor die assembly 100 including the four semiconductor dies 102a-102d having the measurement features 132a-132d, respectively, formed thereon. The interconnects 104 are omitted in FIG. 4 for purposes of clarity. In the illustrated embodiment, the measurement features 132 are vertically aligned (e.g., superimposed over one another) within the assembly 100 and are visible at the side of the assembly 100. Distances between pairs of the measurement features 132 can be measured to determine the die-to-die separations of the semiconductor dies 102. For example, as described in further detail below with reference to FIG. 5, one or more image capture devices can capture an image(s) of the semiconductor die assembly 100, the measurement features 132 can be detected in the captured image(s), and the image(s) analyzed to determine one or more distances between two or more of the measurement features 132. In the illustrated embodiment, for example, the separation between the first and fourth semiconductor dies 102a, 102d can be determined based on measured distances $D_1$ between adjacent, vertically aligned pairs of the first and fourth measurement features 132a, 132d. Similarly, the separation between the first and second semiconductor dies 102a, 102b can be determined based on measured distances $D_2$ between adjacent, vertically aligned pairs of the first and second measurement features 132a, 132b. Likewise, the separation between the second and third semiconductor dies 102b, 102c can be determined based on measured distances $D_3$ between adjacent, vertically aligned pairs of the second and third measurement features 132b, 132c.

In some embodiments, the thickness of the semiconductor dies 102 can be generally known (e.g., between about 50-80 μm) such that the measured distances $D_1$, $D_2$, and/or $D_3$ correspond to a thickness (e.g., a bond line thickness) of the interconnects 104. Likewise, in some embodiments, the thickness of the conductive pillars 112 and conductive pads 110 can be generally known—both before and after a TCB operation—such that the measured distances $D_1$, $D_2$, and/or $D_3$ correspond to a thickness of the bond material 114. Although the measurement features 132 are generally vertically aligned within the assembly 100 in the illustrated embodiment, in some embodiments, the measurement features 132 are not vertically aligned. Moreover, in certain embodiments, the measurement features 132 are not visible at the side of the assembly 100 after an underfill or mold material is deposited or otherwise formed around the semiconductor dies 102.

Figure 5:
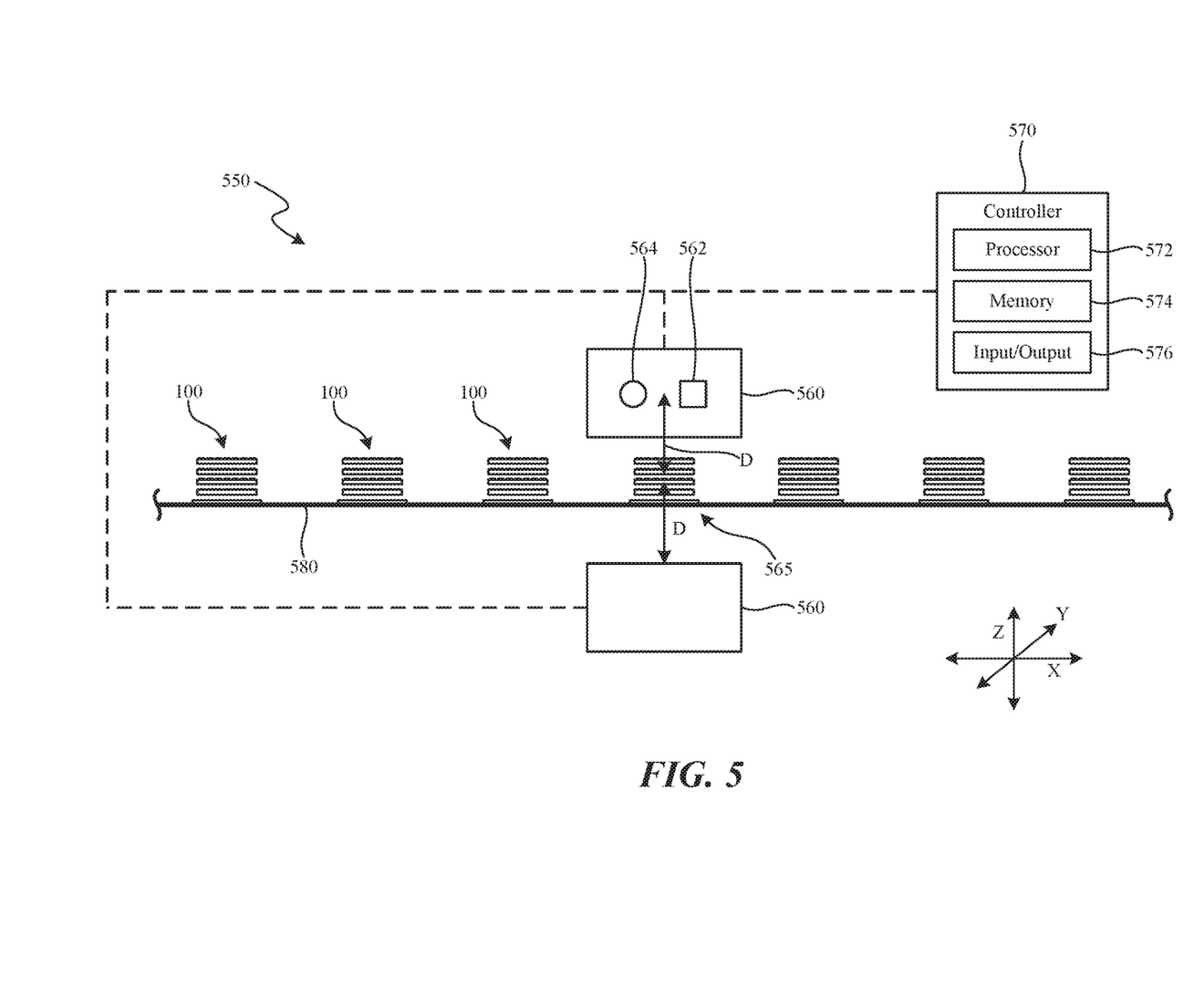
FIG. 5 is a schematic view of a system for measuring a semiconductor die assembly in accordance with embodiments of the present technology.

FIG. 5 is a schematic view of a system 550 for detecting measurement features and measuring semiconductor die assemblies in accordance with embodiments of the present technology. The system 550 can include one or more image capture devices 560 operatively coupled to a controller 570 and positioned adjacent to an assembly transport (e.g., an actuator) 580 carrying a plurality of semiconductor die assemblies having measurement features such as, for example, the assemblies 100 described in detail above. The assembly transport 580 can be configured to move the assemblies 100 toward and/or past the image capture devices 560, for example, by moving the assemblies 100 along the direction of axis X. In some embodiments, the assemblies 100 can be manufactured in a strip form such that they can be translated pass the image capture devices 560 one at a time. In other embodiments, the assemblies 100 can be manufactured in discrete package form, matrix form, wafer form, and/or panel form and the assembly transport 580 can be configured to move the discrete package, matrix, wafer, and/or panel past the image capture devices 560. In other embodiments, the image capture devices 560 can be configured to move relative to the assemblies 100.

The controller 570 can include a processor 572 coupled to a memory 574 and an input/output component 576. The processor 572 can be a microprocessor, a field-programmable gate array, and/or other suitable logic devices. The memory 574 can include volatile and/or nonvolatile media (e.g., ROM, RAM, magnetic disk storage media, optical storage media, flash memory devices, etc.) and/or other types of computer-readable storage media configured to store data. The memory 574 can store algorithms for detecting measurement features, image processing, image filtering, etc., that can be executed by the processor 572. In some embodiments, the processor 572 can send data to a computing device operatively coupled (e.g., over the Internet) to the controller 570, such as a server or personal computer. The input/output component 576 can include a display, a touch screen, a keyboard, a mouse, and/or other suitable types of input/output devices configured to accept input from and provide output to an operator.

In the illustrated embodiment, the system 550 includes two image capture devices 560 positioned at an imaging station 565 and each having an illumination source 562 and an image sensor 564. As shown, the image capture devices 560 can be positioned along an axis Y and can face different sides of an assembly 100 positioned at the imaging station 565. In some embodiments, the image capture devices 560 can each be positioned a known distance D from the assembly 100. The illumination source 562 is configured to illuminate (e.g., with visible light, infrared radiation, UV light, etc.) the assembly 100 while the image sensor 564 is configured to capture light reflected from the assembly 100 and send the captured imaging data to the controller 570, where it is stored in the memory 574, processed by the processor 572, and/or sent to the input/output component 576. In some embodiments, the image sensor 564 is configured to capture radiation that is not in the visible spectrum, such as UV light or infrared radiation. Alternatively, the image sensor 564 can capture imaging data of the assembly 100 positioned at the imaging station 565 in both the visible and nonvisible radiation spectrums and send this imaging data to the controller 570. Although not shown in FIG. 1, the image sensor 564 can include a lens, aperture, image sensing component, digital signal processor, and/or analog or digital output.

Although the image sensor 564 is shown next to the illumination source 562 in FIG. 5, in some embodiments the image sensor 564 and illumination source 562 can have different configurations, and/or the image capture devices 560 may omit the illumination source 562. Moreover, in certain embodiments, the system 550 can include one, or more than the two illustrated image capture devices 560, and the image capture devices 560 can be positioned differently with respect to the assembly transport 580. For example, in certain embodiments, the system 550 includes an additional image capture device 560 positioned above the imaging station 565 (e.g., along an axis Z) and configured to face a top of the assembly 100 positioned at the imaging station 565. In some such embodiments, the image capture device 560 positioned above the assembly 100 can capture images of the measurement features on a single semiconductor die of the assembly 100 (e.g., the first measurement features 132a illustrated in FIG. 3) and, for example, the processor 572 can process the images to determine whether the single semiconductor die is cracked, as described in detail above.

Figure 6:
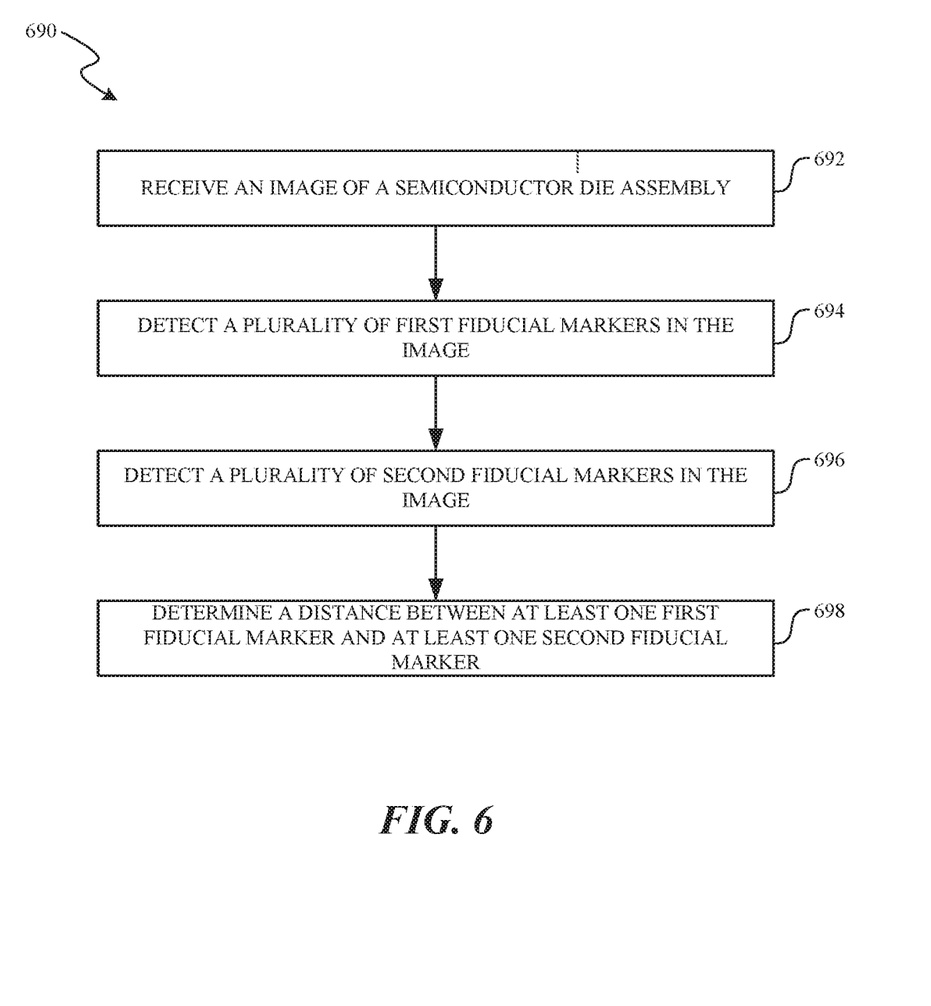
FIG. 6 is a is a flow diagram of a process or method for measuring a semiconductor die assembly in accordance with embodiments of the present technology.

FIG. 6 is a flow diagram of a process or method 690 for detecting and measuring a dimension of a semiconductor die assembly in accordance with embodiments of the present technology. The method 690 can be implemented, for example, using the system 550 to measure the semiconductor die assembly 100 described in detail above with reference to FIGS. 1-5. For example, the image capture devices 560 and/or the controller 570 can be used to perform the various steps of the method 690. Accordingly, for sake of illustration, some features of the method 690 will be described in the context of the embodiments shown in FIGS. 1-5.

Beginning at block 692, the method 690 comprises receiving an image of the semiconductor die assembly 100. For example, one or more of the image capture devices 560 can capture imaging data of the assembly 100 when the assembly 100 is positioned at the imaging station 565, and the controller 570 can receive the imaging data from the image capture devices 560.

At block 694, the method 690 includes detecting a plurality of first measurement features in the image. For example, the processor 572 can process the imaging data to detect a portion of the measurement features 132 formed on one of the semiconductor dies 102 in the assembly (e.g., the portion of the first measurement features 132a spaced along one of the sides 307 of the first semiconductor die 102a). At block 696, the method 690 includes detecting a plurality of second measurement features in the image. For example, the processor 572 can process the imaging data to detect a portion of the measurement features 132 formed on a second one of the semiconductor dies 102 in the assembly (e.g., the portion of the second measurement features 132b spaced along one of the sides 307 of the second semiconductor die 102b). Notably, the processor 572 can reliably identify the measurement features 132 in the imaging data because the measurement features 132 are positioned near the perimeter of the assembly 100.

At block 698, the method 690 includes determining a distance between at least one first measurement feature and at least one second measurement feature. In some embodiments, the distance (e.g., the distance $D_2$) can be calculated based on the known distance D between the image capture devices 560 and the assembly 100. In some embodiments, the image sensors 564 of the image capture devices 560 are configured to autofocus at the fixed distance D, and the distance between the at least one first measurement feature and the at least one second measurement feature can be determined based on a pixel separation between the measurement features and a known pixel size. As described in detail above, the determined distance can be used to estimate a bond line thickness between two or more of the semiconductor dies 102 in the assembly 100 (e.g., between the first and second semiconductor dies 102a, 102b).

In some embodiments, the method 690 can be repeated and/or extended to determine die-to-die separations for each semiconductor die 102 in the assembly 100. For example, in some embodiments, the method 690 can be performed after all of the semiconductor dies 102 in the assembly are stacked (e.g., attached together via successive TCB operations). In other embodiments, the method 690 can be performed after each successive semiconductor die 102 is stacked (e.g., after each individual TCB operation).

The method 690 advantageously provides for the measurement of a semiconductor die assembly quickly (e.g., immediately after a TCB operation to stack semiconductor dies) and without requiring a physical measurement of the assembly. A physical measurement of the die-to-die separation is often not accurate due to the chipping of the semiconductor die edges caused by singulation. Thus, conventional techniques for measuring die-to-die separation and/or the quality of a TCB operation typically require electrical testing of the completed assemblies and/or mechanical cross sections of representative ones of the assemblies. Electrical testing often cannot be performed until after the die-stacking process and the completion of the semiconductor die assembly. Thus, such testing risks deviation in the materials after die-stacking and reduces yield/increases cost since further processing steps may be carried out even where the TCB operation was not of the required quality. Similarly, material cross-sections are destructive and cannot be used to test every one of the assemblies. Accordingly, embodiments of the present technology are expected to increase the yield and reduce the cost of manufacturing semiconductor die assemblies.

In accordance with another aspect of the present technology, the measured distances between the measurement features 132 can be used as feedback in a TCB operation to further simplify and improve the quality of the TCB operation. For example, referring to FIGS. 2A and 2B, during a TCB operation, a force can be applied to two or more of the semiconductor dies 102 (e.g., the first and second semiconductor dies 102a, 102b) while the bond materials 114 in the interconnects 104 are reflowed. The die-to-die separation measured using the measurement features 132 can be used to determine the gap G between at least some of the conductive pads 110 and the conductive pillars 112 (e.g., based on the known thickness of the semiconductor dies 102, the conductive pads 110, and the conductive pillars 112). For example, in one embodiment, one or more of the image capture devices 560 of the system 550 (FIG. 5) can capture imaging data of the assembly 100 during the TCB operation and the processor 572 can process the imaging data in real-time or near real-time to determine the gap G. Such feedback can improve the consistency and quality of TCB operations by substantially ensuring that the gap G is within a desired range at the end of a TCB operation.

Figure 7A:
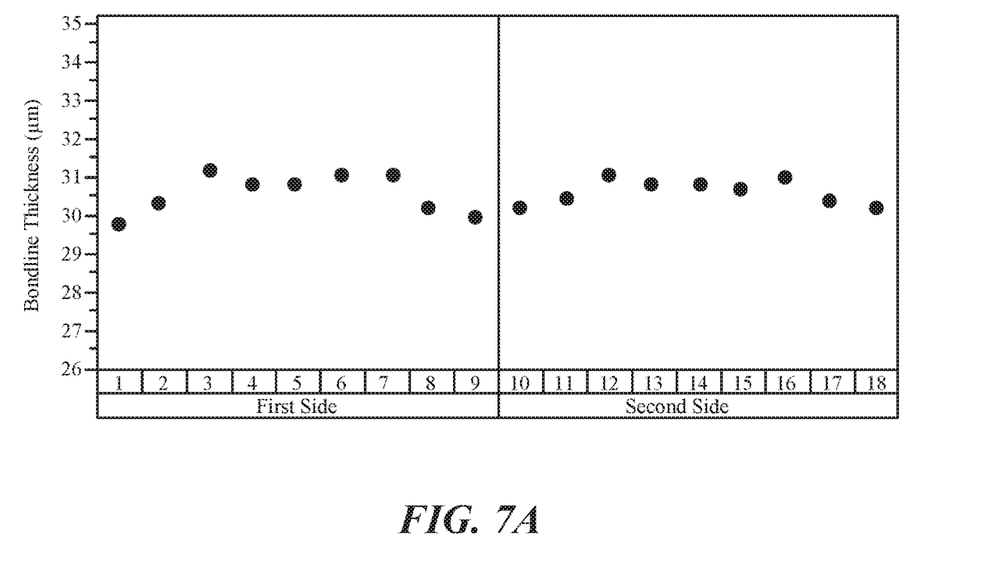
FIGS. 7A-7C are graphs illustrating bond line thickness data for a semiconductor die assembly in accordance with embodiments of the present technology.
Figure 7B:
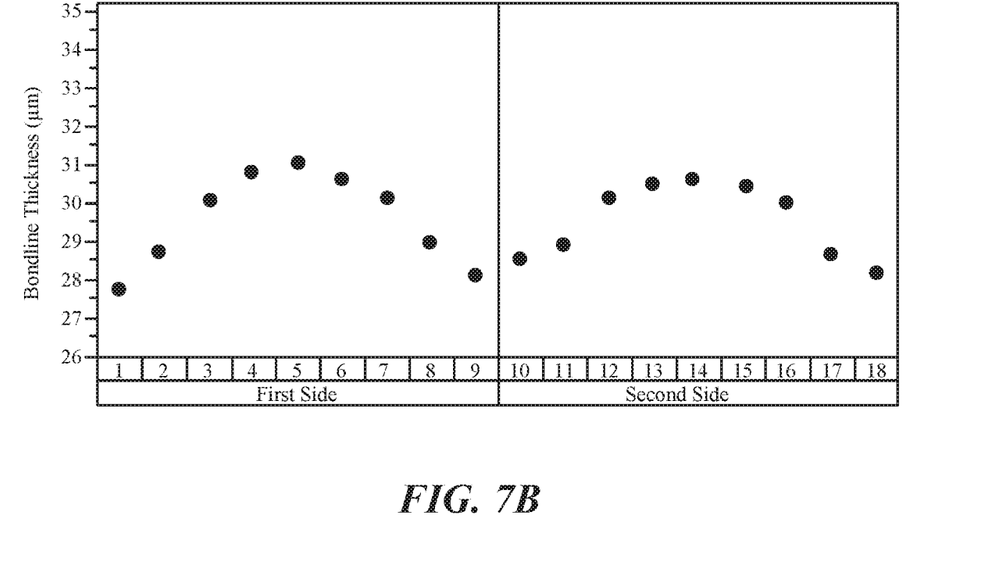
Figure 7C:
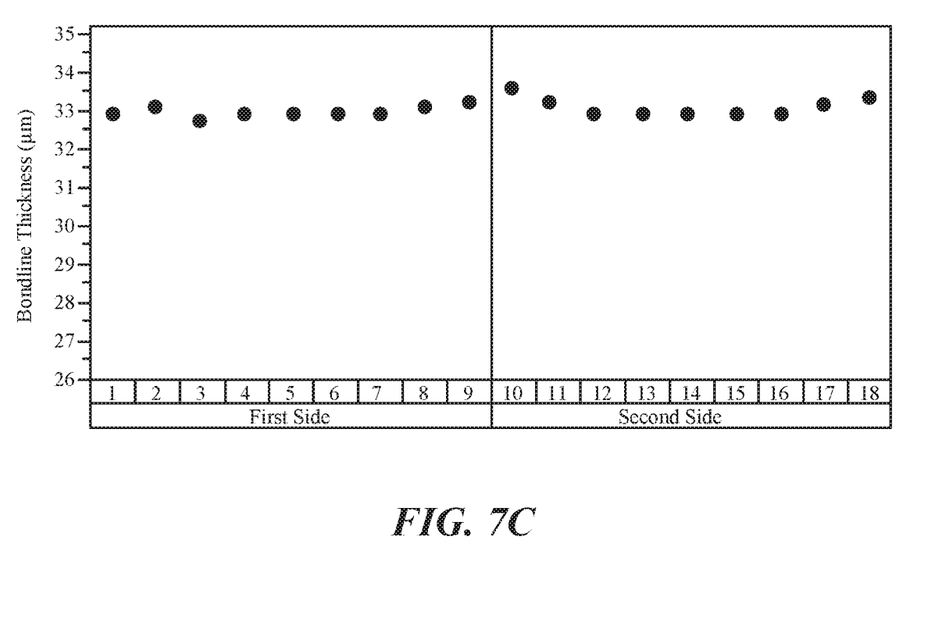

Referring to FIGS. 1-4 together, in some embodiments, the measured bond line thicknesses of the assembly 100 can be used to determine an amount of warpage of the semiconductor dies 102, a degree of parallelism of the semiconductor dies 102, and/or other properties of the semiconductor die assembly 100. In particular, because the assembly 100 includes multiple measurement features 132 spaced along one or more of the sides 307 of the semiconductor dies 102, the assembly 100 allows for data with sufficient resolution to show curvature across a dimension of the semiconductor dies 102. For example, FIGS. 7A-7C are graphs illustrating bond line thickness data for the semiconductor die assembly 100 between the first and fourth semiconductor dies 102a, 102d, between the first and second semiconductor dies 102a, 102b, and between the second and third semiconductor dies 102b, 102c, respectively, in accordance with embodiments of the present technology. The x-axis in FIGS. 7A-7C represents a measurement derived from each pair of nine vertically aligned measurement features 132 on the adjacent semiconductor dies 102. The x-axis further includes measurements from opposing first and second sides of the semiconductor dies 102 (e.g., from the opposing first sides 307a or the opposing second sides 307b). The y-axis in FIGS. 7A-7C represents the bond line thickness (e.g., the thickness of the interconnects 104) measured in microns.

In the embodiment illustrated in FIG. 7A, the data of bond line thickness between the first and fourth semiconductor dies 102a, 102d indicates that the semiconductor dies 102a, 102d are slightly warped and/or slightly out of planar alignment since the bond line thickness increases slightly (e.g., by about 1-2 μm) toward the middle of the first and second sides. Moreover, the data indicates that the semiconductor dies 102a, 102d may not be significantly warped in a direction extending between the first and second sides since the bond line thickness measurements are generally constant between the first and second sides (e.g., corresponding data points for the first and second sides generally have the same magnitude).

In the embodiment illustrated in FIG. 7B, the data of bond line thickness between the first and second semiconductor dies 102a, 102b indicates that the semiconductor dies 102a, 102b are significantly warped and/or out of parallel alignment since the bond line thickness increases significantly (e.g., by about 3-4 μm) toward the middle of the first and second sides. Again, the data indicates that the semiconductor dies 102a, 102b may not be significantly warped in a direction extending between the first and second sides since the bond line thickness measurements are generally constant between the first and second sides. Notably, in each of FIGS. 7A and 7B, any warpage of the semiconductor dies 102 may not be detectable using only the measurement features 132 positioned near a corner of the semiconductor dies 102 (e.g., the pairs of measurement features represented on the x-axis by the numbers "1," "9," "10," and "18"), since those data points suggest a generally constant bond line thickness (e.g., about 30 μm in FIG. 7A and about 28 μm in FIG. 7B). Accordingly, by spacing the measurement features 132 along the first and second sides of the semiconductor dies 102, the present technology enables a higher resolution and more robust analysis of bond line thicknesses.

In the embodiment illustrated in FIG. 7C, the data of bond line thickness between the second and third semiconductor dies 102b, 102c indicates that the semiconductor dies 102b, 102c are not significantly warped and/or are generally in parallel alignment since the bond line thickness is generally constant (e.g., about 33 μm) along the first and second sides. In certain embodiments, the relatively high bond line thickness may indicate that the bond material 114 did not collapse much, and therefore that the TCB operation was of lesser quality.

Figure 8:
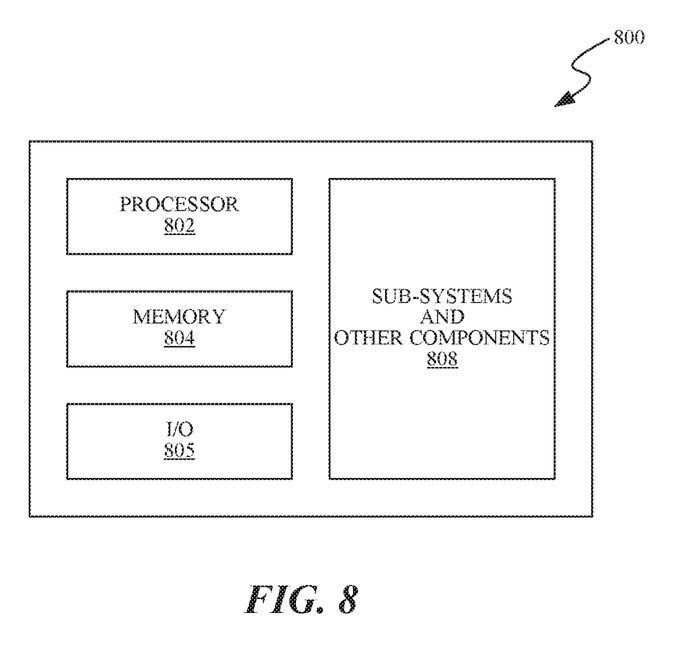
FIG. 8 is a schematic view of a system that includes a semiconductor device configured in accordance with embodiments of the present technology.

Any one of the semiconductor devices having the features described above (e.g., with reference to FIGS. 1-4) can be incorporated into any of a myriad of larger and/or more complex systems, a representative example of which is system 800 shown schematically in FIG. 8. The system 800 can include a processor 802, a memory 804 (e.g., SRAM, DRAM, flash, and/or other memory devices), input/output devices 805, and/or other subsystems or components 808. The semiconductor dies and semiconductor die assemblies described above can be included in any of the elements shown in FIG. 8. The resulting system 800 can be configured to perform any of a wide variety of suitable computing, processing, storage, sensing, imaging, and/or other functions. Accordingly, representative examples of the system 800 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 800 include lights, cameras, vehicles, etc. With regard to these and other example, the system 800 can be housed in a single unit or distributed over multiple interconnected units, e.g., through a communication network. The components of the system 800 can accordingly include local and/or remote memory storage devices and any of a wide variety of suitable computer-readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Certain aspects of the present technology may take the form of computer-executable instructions, including routines executed by a controller or other data processor. In some embodiments, a controller or other data processor is specifically programmed, configured, and/or constructed to perform one or more of these computer-executable instructions. Furthermore, some aspects of the present technology may take the form of data (e.g., non-transitory data) stored or distributed on computer-readable media, including magnetic or optically readable and/or removable computer discs as well as media distributed electronically over networks. Accordingly, data structures and transmissions of data particular to aspects of the present technology are encompassed within the scope of the present technology. The present technology also encompasses methods of both programming computer-readable media to perform particular steps and executing the steps.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Further, while advantages associated with certain embodiments of the technology have been described in the context of those embodiments, other embodiments may also exhibit such advantages, and not all embodiments need necessarily exhibit such advantages to fall within the scope of the technology. Accordingly, the

We claim:

1. A semiconductor die assembly, comprising:
    a first semiconductor die including:
        a first region adjacent to at least one side of the first semiconductor die; and
        a plurality of first measurement features on a surface of the first semiconductor die at the first region, wherein the first measurement features comprise a first metal material;
    a second semiconductor die stacked over the first semiconductor die and including;
        a second region adjacent to at least one side of the second semiconductor die; and
        a plurality of second measurement features on a surface of the second semiconductor die at the second region, wherein the second measurement features are vertically aligned with corresponding ones of the first measurement features; and
    a plurality of interconnects electrically coupling the first and second semiconductor dies, wherein the interconnects each include a conductive pad on the first semiconductor die, and wherein the conductive pads comprise a second metal material that is the same as the first metal material.

2. The semiconductor die assembly of claim 1 wherein distances between corresponding ones of the pluralities of first and second measurement features correspond to thicknesses of individual ones of the interconnects.

3. The semiconductor die assembly of claim 1 wherein the surface of the first semiconductor die is an upper surface of the first semiconductor die, wherein the surface of the second semiconductor die is an upper surface of the second semiconductor die, and wherein the second semiconductor die is stacked over the first semiconductor die such that a lower surface of the second semiconductor die faces the upper surface of the first semiconductor die.

4. The semiconductor die assembly of claim 3, further comprising a plurality of through-silicon vias (TSVs) extending through the first semiconductor die, wherein the interconnects each include:
    a conductive pad on the upper surface of the first semiconductor die at a third region of the first semiconductor die inboard of the first region, the conductive pad electrically coupled to a corresponding one of the TSVs;
    a conductive pillar on the lower surface of the second semiconductor die at a fourth region of the second semiconductor die inboard of the second region; and
    a bond material electrically coupling the conductive pad and the conductive pillar.

5. The semiconductor die assembly of claim 4 wherein the TSVs are first TSVs, wherein the conductive pads are first conductive pads, and further comprising:
    a plurality of second TSVs extending through the second semiconductor die, wherein the second TSVs are electrically coupled to corresponding ones of the conductive pillars; and
    a plurality of second conductive pads on the upper surface of the second semiconductor die at the fourth region, wherein the second conductive pads are electrically coupled to the second TSVs, wherein the second measurement features are made from a material that is the same as the second conductive pads, and wherein the second measurement features have a thickness that is the same as the second conductive pads.

6. The semiconductor die assembly of claim 1 wherein the first and second semiconductor dies each have a rectilinear planform shape, and wherein the first measurement features are spaced apart along the first region adjacent to a single side of the first semiconductor die, and wherein the second measurement features are spaced apart along the second region adjacent to a single side of the second semiconductor die.

7. The semiconductor die assembly of claim 1 wherein the first and second semiconductor dies each have a rectilinear planform shape including opposing first sides and opposing second sides, wherein the first measurement features are spaced apart along the first region adjacent to the opposing first sides of the first semiconductor die, and wherein the second measurement features are spaced apart along the second region adjacent to the opposing first sides of the second semiconductor die.

8. The semiconductor die assembly of claim 1 wherein the first measurement features are spaced apart along the first region adjacent to a perimeter of the first semiconductor die, and wherein the second measurement features are spaced apart along the second region adjacent to a perimeter of the second semiconductor die.

9. The semiconductor die assembly of claim 1 wherein the first and second measurement features are not electrically coupled to either of the first and second semiconductor dies.

10. A semiconductor die assembly, comprising:
    a first semiconductor die including:
        a first region adjacent to at least one side of the first semiconductor die;
        a plurality of first measurement features on an upper surface of the first semiconductor die at the first region; and
        a plurality of through-silicon vias (TSVs) extending therethrough;
    a second semiconductor die stacked over the first semiconductor die such that a lower surface of the second semiconductor die faces the upper surface of the first semiconductor die, and wherein the second semiconductor die includes:
        a second region adjacent to at least one side of the second semiconductor die; and a plurality of second measurement features on an upper surface of the second semiconductor die at the second region, wherein the second measurement features are vertically aligned with corresponding ones of the first measurement features; and
    a plurality of interconnects electrically coupling the first and second semiconductor dies, wherein the interconnects each include:
        a conductive pad on the upper surface of the first semiconductor die at a third region of the first semiconductor die inboard of the first region, the conductive pad electrically coupled to a corresponding one of the TSVs, wherein the first measurement features comprise a metal material that is the same as a metal material of the conductive pads;
        a conductive pillar on the lower surface of the second semiconductor die at a fourth region of the second semiconductor die inboard of the second region; and
        a bond material electrically coupling the conductive pad and the conductive pillar.

11. A semiconductor die assembly, comprising:
    a first semiconductor die including:
        a first region adjacent to at least one side of the first semiconductor die;

a plurality of first measurement features on an upper surface of the first semiconductor die at the first region; and
a plurality of through-silicon vias (TSVs) extending therethrough;
a second semiconductor die stacked over the first semiconductor die such that a lower surface of the second semiconductor die faces the upper surface of the first semiconductor die and wherein the second semiconductor die includes:
a second region adjacent to at least one side of the second semiconductor die; and
a plurality of second measurement features on an upper surface of the second semiconductor die at the second region, wherein the second measurement features are vertically aligned with corresponding ones of the first measurement features; and
a plurality of interconnects electrically coupling the first and second semiconductor dies, wherein the interconnects each include:
a conductive pad on the upper surface of the first semiconductor die at a third region of the first semiconductor die inboard of the first region, the conductive pad electrically coupled to a corresponding one of the TSVs, wherein the first measurement features have a thickness that is the same as a thickness of the conductive pads;
a conductive pillar on the lower surface of the second semiconductor die at a fourth region of the second semiconductor die inboard of the second region; and
a bond material electrically coupling the conductive pad and the conductive pillar.

12. The semiconductor die assembly of claim 11 wherein the thickness of the first measurement features and the conductive pads is between about 1-5 μm.

13. A semiconductor die assembly, comprising:
a first semiconductor die including:
a first region adjacent to at least one side of the first semiconductor die; and
a plurality of first measurement features on a surface of the first semiconductor die at the first region, wherein the first measurement features have a first thickness;
a second semiconductor die stacked over the first semiconductor die and including:
a second region adjacent to at least one side of the second semiconductor die; and
a plurality of second measurement features on a surface of the second semiconductor die at the second region, wherein the second measurement features are vertically aligned with corresponding ones of the first measurement features; and
a plurality of interconnects electrically coupling the first and second semiconductor dies, wherein the interconnects each include a conductive pad on the first semiconductor die, and wherein the conductive pads have a second thickness that is the same as the first thickness.

* * * * *